(12) United States Patent
Cheng

(10) Patent No.: US 8,325,492 B2
(45) Date of Patent: Dec. 4, 2012

(54) EXPANSION CARD RETENTION ASSEMBLY

(75) Inventor: Da-Qing Cheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 405 days.

(21) Appl. No.: 12/576,662

(22) Filed: Oct. 9, 2009

(65) Prior Publication Data

US 2011/0008103 A1 Jan. 13, 2011

(30) Foreign Application Priority Data

Jul. 13, 2009 (CN) .......................... 2009 1 0304307

(51) Int. Cl.
*H05K 7/14* (2006.01)

(52) U.S. Cl. ....................................................... 361/801

(58) Field of Classification Search .................. 361/801, 361/679.31, 679.32, 737, 740, 741, 752–753, 361/756, 759, 802
See application file for complete search history.

(56) References Cited

U.S. PATENT DOCUMENTS

2009/0296363 A1* 12/2009 Dai ............................... 361/801

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

A retention assembly includes a platform, a bracket, and a resisting member rotatably connected to the platform. The bracket includes a main portion and a fastening portion. The resisting member includes a resisting portion and a plurality of elastic catching tabs bending from the resisting portion. Each elastic catching tab includes a joining portion and a catching portion. The resisting member fastens the bracket to the platform. The resisting portion resists the fastening portion, and the elastic catching tab catches the main portion. A second angle formed by the joining portion and the catching portion is less than a first angle formed by the main portion and the fastening portion.

12 Claims, 4 Drawing Sheets

EXPANSION CARD RETENTION ASSEMBLY

BACKGROUND

1. Technical Field

The present invention generally relates to retention assemblies for securing a plurality of expansion cards to an electronic device enclosure.

2. Description of Related Art

A typical retention assembly for securing an expansion card to an electronic device enclosure includes a seating plate, a plurality of fasteners, and a plurality of covers. An expansion slot is defined in the electronic device enclosure. A bulge is formed surrounding a periphery of the expansion slot. The covers are configured for covering the expansion slot and securing/protecting the expansion cards. Each of the covers is an elongated piece having a bent portion (not labeled) adjoining to the bulge. When an expansion card is fixed to the electronic device enclosure, the seating plate is positioned on the bent portions of the covers, and is fixed on the electronic device enclosure by the fasteners.

In the above retention assembly, the covers are secured to the electronic device enclosure by the fasteners. However, installing or removing the fasteners to install or remove expansion cards is unduly time-consuming, laborious, and inefficient. In addition, a tool is needed for installing or removing the fasteners. These problems are compounded in mass production situations. Furthermore, after a period of time, the fasteners and receiving holes may not be properly engaged.

Therefore, a retention assembly which overcomes the above-described shortcomings is desired.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTIONS

Figure 1:
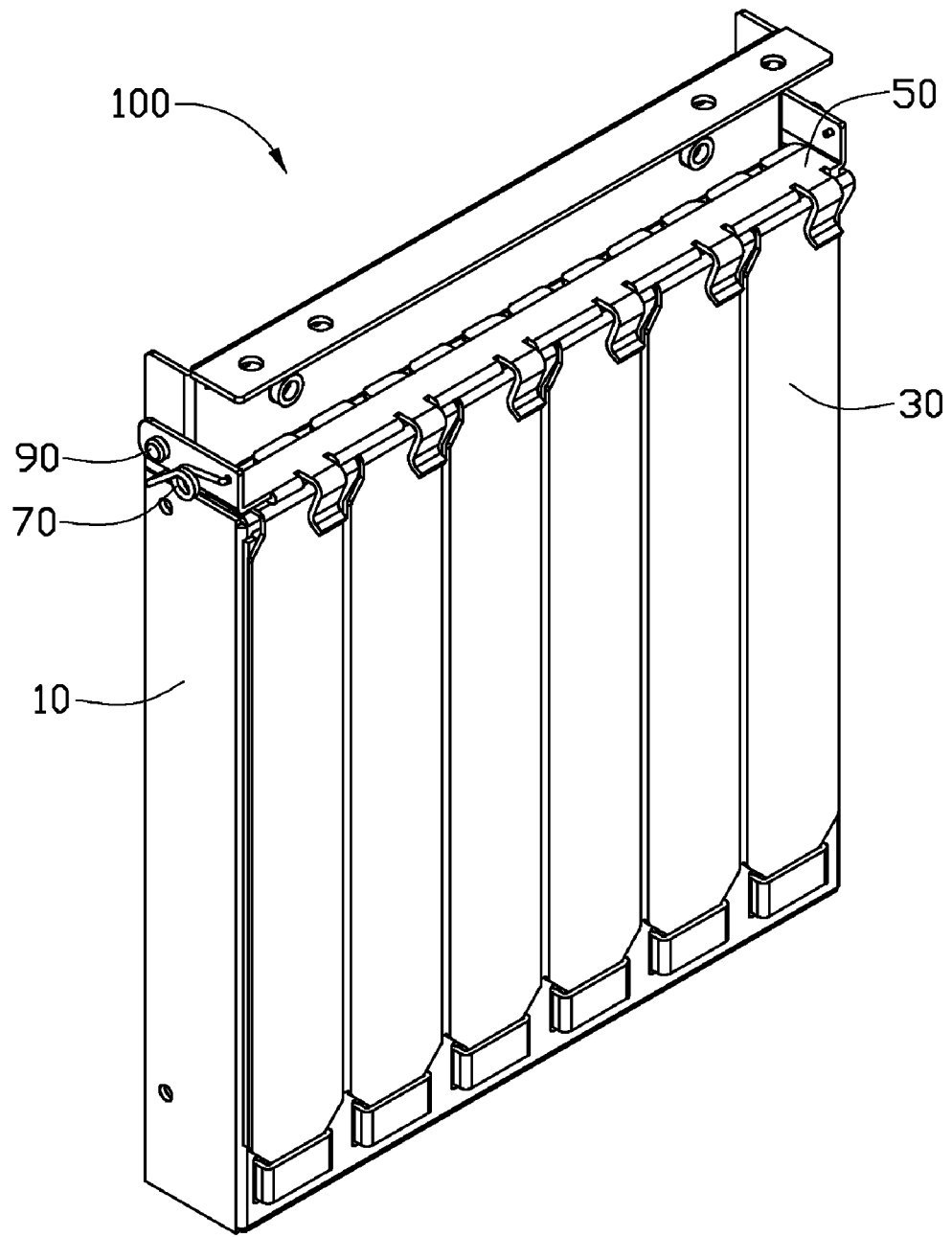
FIG. 1 is an assembled, isometric view of an embodiment of a retention assembly in a closed position, the retention assembly including a platform, a plurality of brackets, a resisting member, two elastic members, and two pivot shafts.

Referring to FIG. 1, an embodiment of a retention assembly 100 includes a platform 10, a plurality of brackets 30, a resisting member 50, two elastic members 70, and two pivot shafts 90. The platform 10 is fixed to an enclosure (not shown) such as an electronic device enclosure. Some of the brackets 30 may have an expansion card (not shown) fixed thereon. When an expansion card is to be connected, a bracket 30 with an expansion card is fastened to the platform 10. Brackets 30 without an expansion card can be fastened to the platform 10.

Figure 2:
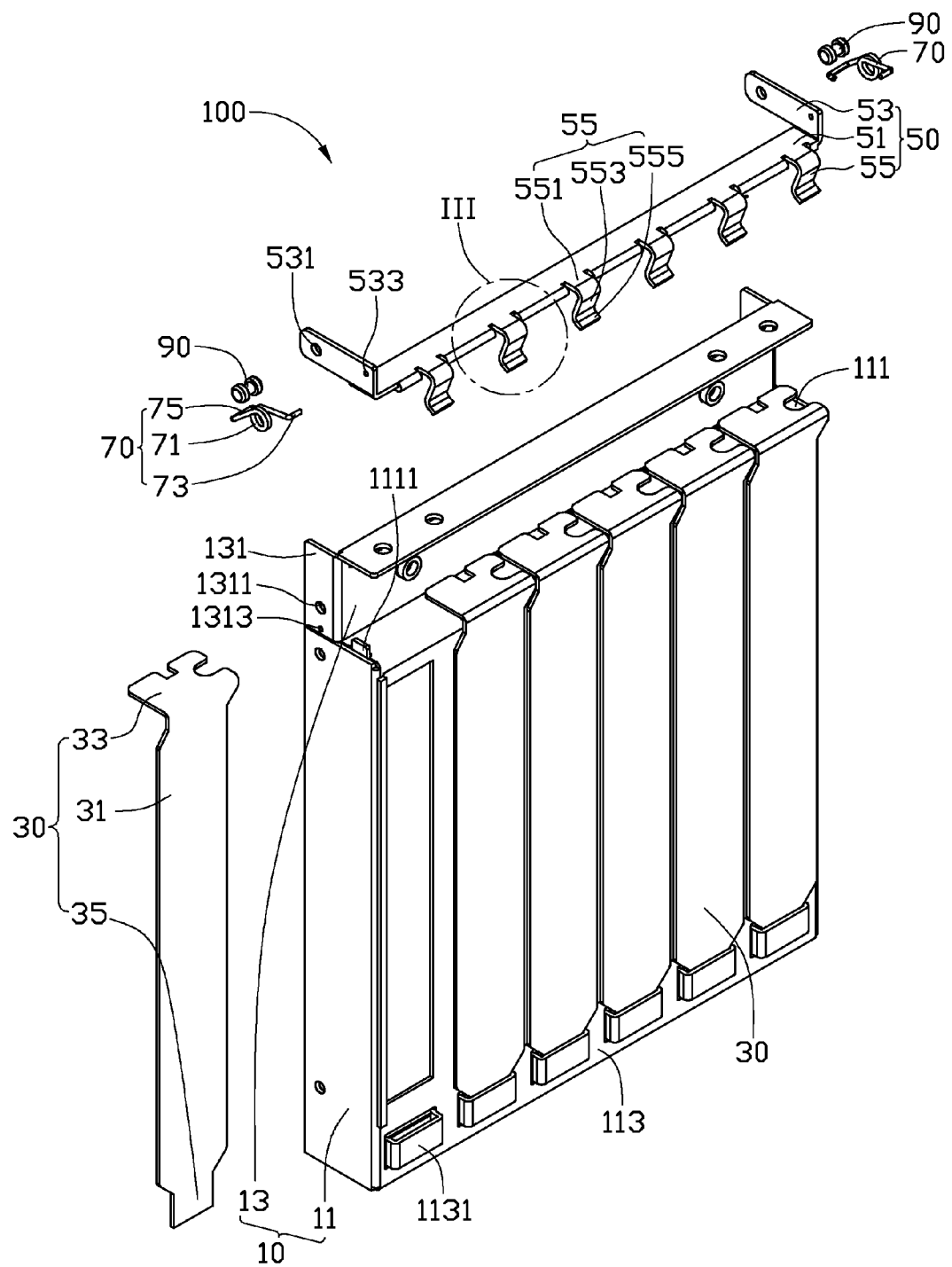
FIG. 2 is a partially exploded, isometric view of the retention assembly of FIG. 1.

Referring to FIG. 2, the platform 10 includes a frame 11 and a connecting portion 13. The frame 11 includes a top surface 111 and a mounting surface 113 substantially perpendicular to the top surface 111. A limiting protrusion 1111 is formed on the top surface 111. A plurality of hooking members 1131 are formed on the mounting surface 113. The connecting portion 13 has two side boards 131 formed at opposite sides thereof. Each side board 131 defines a shaft hole 1311 and a fixing hole 1313.

The bracket 30 is substantially L-shaped and includes an elongated main portion 31, a fastening portion 33 extending substantially perpendicular from an end of the elongated main portion 31, and a tab 35 extending from another end of the main portion 31 opposite to the fastening portion 33. A width of the tab 35 is less than that of the main portion 31. A first angle formed by the main portion 31 and the fastening portion 33 is about 90°.

Figure 3:
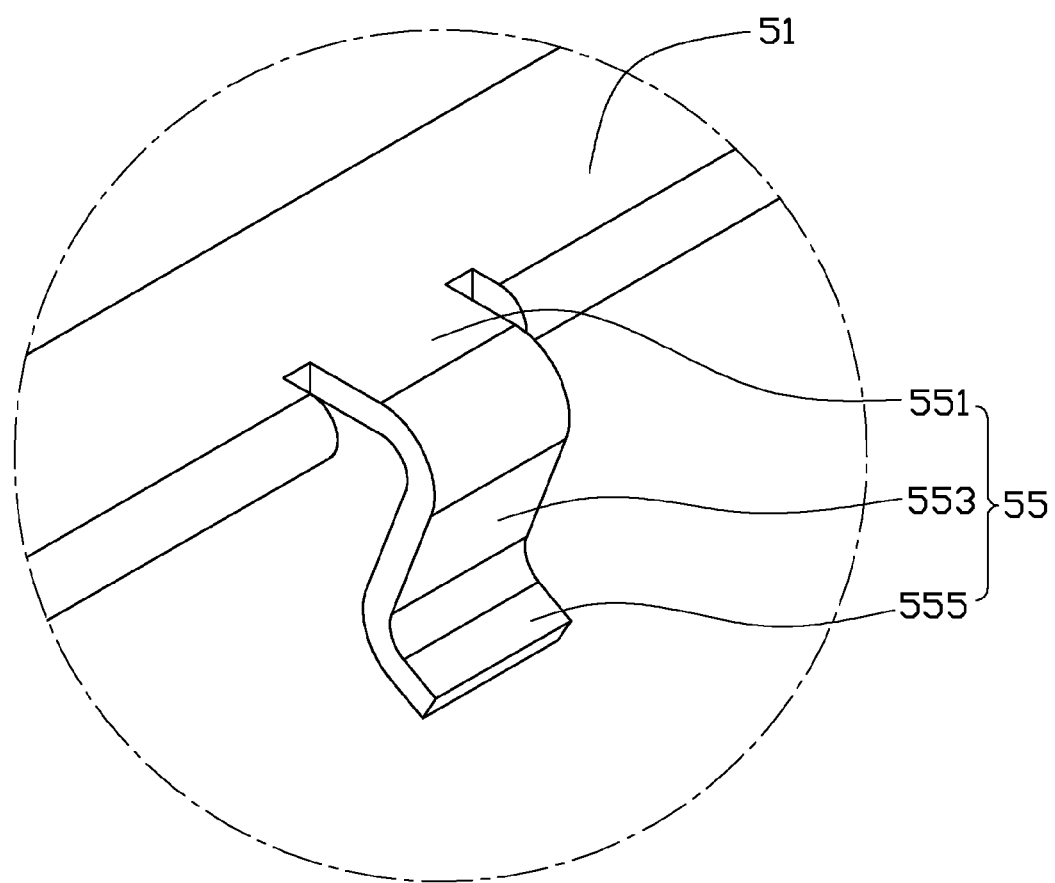
FIG. 3 is a partial, enlarged view of the resisting member of FIG. 1.

Referring to FIG. 2 and FIG. 3, the resisting member 50 includes a resisting portion 51, two connecting arms 53 formed at opposite ends of the resisting portion 51, and a plurality of elastic catching tabs 55 bent from a side edge of the resisting portion 51. Each elastic catching tab 55 includes a joining portion 551 connected to the resisting portion 51, a catching portion 553, and a warped portion 555 arranged in that order. The joints of the joining portion 551, the catching portion 553, and the warped portion 555 are smooth, curved surfaces. The joining portion 551 extends away from the resisting portion 51, the catching portion 553 extends towards the side of the resisting portion 51, and the warped portion 555 extends away from the resisting portion 51, thus forming the S-shaped catching tab 55. A second angle formed by the joining portion 551 and the catching portion 553 is less than the first angle. In the illustrated embodiment, the second angle is less than 90°. Each connecting arm 53 defines a pivot hole 531 and a fixing hole 533.

The elastic member 70 is a torsion spring including a spring circle portion 71, and a first hook 73 and a second hook 75 on two ends thereof. The pivot shafts 90 are pins. After the pivot shaft 90 enters the shaft hole 1311 and the pivot hole 531, two ends of the pivot shaft 90 are riveted.

Figure 4:
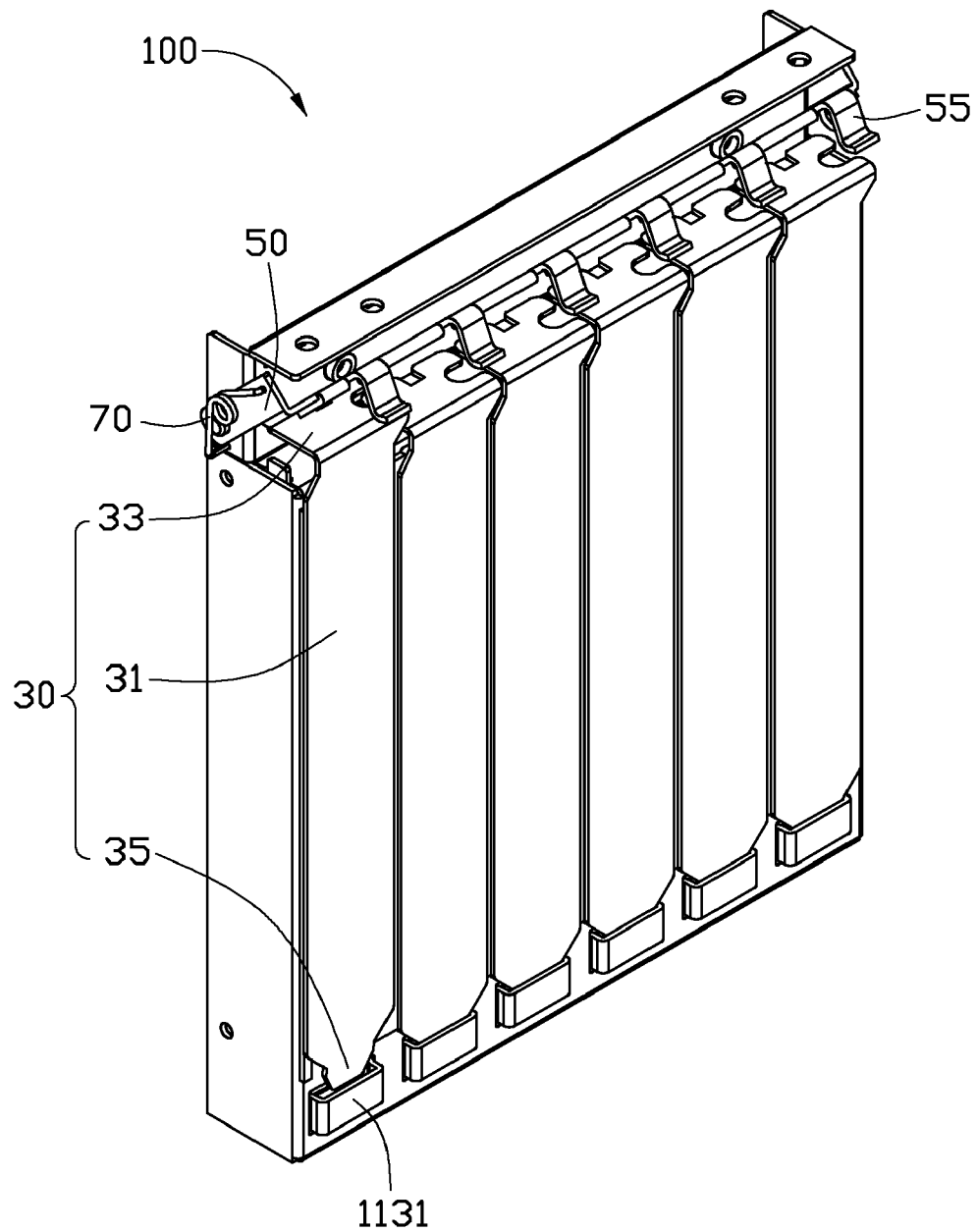
FIG. 4 is similar to FIG. 1, but shows the retention assembly in an open position.

Referring to FIG. 2 through FIG. 4, during assembly of the retention assembly 100, the resisting member 50 is mounted on the top surface 111 of the platform 10. Each of the pivot shafts 90 passes through one shaft hole 1311 and one pivot hole 531 to rotatably connect the resisting member 50 to the platform 10. The first hook 73 is fixed in the fixing hole 533 of the resisting member 50, and the second hook 75 is fixed in the fixing hole 1313 of the platform 10. When the resisting portion 51 of the resisting member 50 approaches the top surface 111 of the platform 10, the elastic member 70 is compressed to apply a force to the top surface 111 or member mounted thereon.

For installation of the bracket 30, a force is applied on the resisting member 50 to pull the resisting member 50 to rotate away from the top surface 111 around the pivot shafts 90. The elastic members 70 are compressed further. The bracket 30 is installed on the frame 11 of the platform 10 with the tab 35 of the bracket 30 engaging the hooking member 1131 and the fastening portion 33 of the bracket 30 resisting the top surface 111. The force applied on the resisting member 50 is removed to allow the resisting member 50 to rotate towards the top surface 111 under force of the elastic members 70, thus resisting the fastening portion 33 of the bracket 30 again. The elastic members 70 are retracted. As such, the bracket 30 is firmly fastened on the platform 10. Removal of the bracket 30 is similar to installation.

When the brackets 30 are installed on the platform 10, the elastic catching tabs 55 deform to firmly catch the corresponding brackets 30. Particularly, even if the brackets 30 have different thicknesses, the resisting member 50 can still firmly hold the brackets 30 because the elastic catching tabs 55 can deform. In addition, no tool is required for installation or removal of the bracket 30.

Alternatively, the elastic members 70 may be extension springs with one end connected to the top surface 111 and the other end connected to the resisting portion 51, the pivot shafts 90 may be alternative forms, such as nuts and bolts, and the second angle may be less than the first angle, in which case the joining portions 551 are inclined towards the resisting portion 51.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being embodiments of the disclosure.

What is claimed is:

1. A retention assembly, comprising:
    a platform comprising a frame having a top surface and a mounting surface substantially perpendicular to the top surface, and a connecting portion formed on the top surface of the frame, the connecting portion comprising two side boards formed at opposite sides thereof;
    a bracket comprising a main portion and a fastening portion extending substantially perpendicular from an end of the main portion, the bracket mounted on the frame of the platform, with the main portion and the fastening portion of the bracket respectively abutting on the corresponding mounting surface and the top surface of the frame;
    two pivot shafts;
    two torsion springs; and
    a resisting member rotatably connected to the connecting portion of the platform via the two pivot shafts, and elastically resisting against the bracket via the two torsion springs, for fastening the bracket to the platform; the resisting member comprising a resisting portion, an elastic catching tab bending from the resisting portion and two connecting arms formed at opposite ends of the resisting portion, the elastic catching tab comprising a joining portion and a catching portion;
    wherein the two connecting arms rotatably connected to the two side boards via the two pivot shafts, each of the two torsion springs comprises two ends respectively connected to one of the two connecting arms and one of the two side boards and exerts an elastic force impelling the resisting member to rotate towards the platform, such that, the resisting portion tightly resists the fastening portion; the elastic catching tab firmly catches the main portion; a second angle defined by the joining portion and the catching portion is less than a first angle defined by the main portion and the fastening portion.

2. The retention assembly of claim 1, comprising a plurality of elastic catching tabs, each elastic catching tab further comprising a warped portion, the joints of the joining portion, the catching portion, and the warped portion being joined smoothly; wherein the joining portion extends away from the resisting portion, the catching portion extends towards the side of the resisting portion, and the warped portion extends away from the resisting portion, thus forming an S-shaped catching tab.

3. The retention assembly of claim 1, wherein the elastic catching tab is formed at an edge of the resisting portion.

4. The retention assembly of claim 1, further comprising a plurality of hooking members formed on the mounting surface, wherein the bracket further comprises a tab extending from an end of the main portion to engage with the hooking member.

5. The retention assembly of claim 4, wherein each side board of the connecting portion defines a shaft hole; each connecting arm of the resisting member defines a pivot hole; each of the two pivot shafts runs through one pivot hole of one connecting arm of the resisting member and one shaft hole of one side board of the connecting portion.

6. A retention assembly, comprising:
    a platform comprising a connecting portion comprising two side boards formed at opposite sides thereof;
    a bracket mounted on the platform;
    two pivot shafts;
    two torsion springs; and
    a resisting member rotatably connected to the platform via the two pivot shafts, and elastically resisting against the bracket via the two torsion springs, for fastening the bracket to the platform tightly; the resisting member comprising a resisting portion, at least one elastic catching tab bending from the resisting portion and two connecting arms formed at opposite ends of the resisting portion;
    wherein the two connecting arms rotatably connected to the two side boards via the two pivot shafts, each of two torsion springs comprises two ends respectively connected to one of the two connecting arms and one of the two side boards and exerts an elastic force impelling the resisting member to rotate towards the platform, the at least one elastic catching tab exerts an elastic force on the platform to hold the bracket.

7. The retention assembly of claim 6, comprising a plurality of elastic catching tabs, each elastic catching tab comprising a joining portion, a catching portion, and a warped portion, the joints of the joining portion, the catching portion, and the warped portion joined smoothly; wherein the joining portion extends away from the resisting portion, the catching portion extends towards the side of the resisting portion, and the warped portion extends away from the resisting portion, thus forming an S-shaped catching tab.

8. The retention assembly of claim 7, wherein the bracket comprises a main portion and a fastening portion; the resisting portion resists the fastening portion under the elastic force exerted by the two torsion springs, and the at least one elastic catching tab catches the main portion, and a second angle formed by the joining portion and the catching portion is less than a first angle formed by the main portion and the fastening portion.

9. The retention assembly of claim 8, wherein the elastic catching tab is formed at an edge of the resisting portion.

10. The retention assembly of claim 6, further comprising a plurality of hooking members formed on the mounting surface, wherein the bracket further comprises a tab extending from an end of the main portion to engage with the hooking member.

11. The retention assembly of claim 10, wherein each side board of the connecting portion of the platform defines a shaft hole; each connecting arm of the resisting member defines a pivot hole; each of the two pivot shafts runs through one pivot hole of one connecting arm of the resisting member and one shaft hole of one side board of the connecting portion.

12. A retention assembly, comprising:
    a platform comprising a frame having a top surface and a mounting surface substantially perpendicular to the top surface, and a connecting portion formed on the top surface of the frame, the connecting portion having two side boards formed at opposite sides thereof, each side board defining a shaft hole and a fixing hole;
two pivot shafts;
two torsion springs; and
a resisting member rotatably connected to the connecting portion of the platform via the two pivot shafts, and elastically resisting against the bracket via the two torsion springs, for fastening the bracket to the platform, the resisting member comprising a resisting portion, two connecting arms formed at opposite ends of the resisting portion, and at least one elastic catching tab bending from a side edge of the resisting portion, each connecting arm defining a pivot hole and a fixing hole; the at least one elastic catching tab comprising a joining portion and a catching portion;
wherein, the two connecting arms of the resisting member are rotatably hinged to the two side boards of the connecting portion of the platform via the two pivot shafts, the two torsion springs each comprises two ends respectively connected to one side board of the platform and one connecting arm of the resisting member; the two torsion springs cooperatively exert an elastic force impelling the resisting member to rotate towards the platform.

* * * * *